United States Patent
Tang

(10) Patent No.: US 12,431,913 B1
(45) Date of Patent: Sep. 30, 2025

(54) DYNAMIC PREDICTIVE SAMPLING AND PROCESSING

(71) Applicant: Arrowhead Center, Inc., Las Cruces, NM (US)

(72) Inventor: Wei Tang, Las Cruces, NM (US)

(73) Assignee: Arrowhead Center, Inc., Las Cruces, NM (US)

( * ) Notice: Subject to any disclaimer, the term of this patent is extended or adjusted under 35 U.S.C. 154(b) by 172 days.

(21) Appl. No.: 18/212,811

(22) Filed: Jun. 22, 2023

Related U.S. Application Data

(60) Provisional application No. 63/354,511, filed on Jun. 22, 2022.

(51) Int. Cl.
*H03M 1/12* (2006.01)
*H03M 1/06* (2006.01)
*H03M 1/34* (2006.01)

(52) U.S. Cl.
CPC ....... *H03M 1/1245* (2013.01); *H03M 1/0626* (2013.01); *H03M 1/34* (2013.01)

(58) Field of Classification Search
CPC ..... H03M 1/1245; H03M 1/0626; H03M 1/34
USPC ................... 341/155, 143, 144, 126
See application file for complete search history.

(56) References Cited

U.S. PATENT DOCUMENTS

| | | | |
|---|---|---|---|
| 4,308,524 A * | 12/1981 | Harrison | H03M 1/40 341/122 |
| 4,448,196 A | 5/1984 | Money et al. | |
| 4,567,883 A | 2/1986 | Langer | |
| 5,014,284 A | 5/1991 | Langer et al. | |
| 5,150,324 A | 9/1992 | Takasuka et al. | |
| 5,200,750 A | 4/1993 | Fushiki et al. | |
| 5,301,677 A | 4/1994 | Hsung | |

(Continued)

FOREIGN PATENT DOCUMENTS

| CA | 2003428 | 12/1999 |
|---|---|---|
| CN | 205041393 | 2/2016 |

(Continued)

OTHER PUBLICATIONS

Agarwal, R. , et al., "Adaptive asynchronous analog to digital conversion for compressed biomedical sensing", Proc. IEEE Biomed. Circuits Syst. Conf., 2009, 69-72.

(Continued)

*Primary Examiner* — Peguy Jean Pierre
(74) *Attorney, Agent, or Firm* — Peacock Law P.C.; Justin R. Jackson; Daniel Berenger-Russell

(57) ABSTRACT

A method and apparatus that provides a digital approximation of an input analog continuous-time signal using piecewise linear waveform from key sampling points selected by a dynamic predictive sampling method. The apparatus includes a processing system or block to generate a dynamic prediction of the input signal as well as an upper threshold and a lower threshold to form a tracking window, a comparator that compares the input signal with the upper threshold and the lower threshold to determine if the prediction is successful, a counter to record timestamps between the unsuccessful predictions which are the selected key sampling points, and a processing block controlling predictions and sampling states of the system. The processing of the sampling points can include a neighbor amplitude filter and a slope filter.

39 Claims, 7 Drawing Sheets

(56) References Cited

U.S. PATENT DOCUMENTS

| | | | |
|---|---|---|---|
| 5,343,420 A * | 8/1994 | Murata | H04N 1/32704 708/300 |
| 5,349,353 A | 9/1994 | Zrilic | |
| 5,392,040 A | 2/1995 | Hayashi | |
| 5,990,818 A | 11/1999 | McGrath | |
| 6,150,969 A | 11/2000 | Melanson | |
| 6,285,306 B1 | 9/2001 | Zrilic | |
| 6,362,762 B1 | 3/2002 | Jensen et al. | |
| 6,437,718 B1 | 8/2002 | Oyama et al. | |
| 6,492,929 B1 | 12/2002 | Coffey et al. | |
| 6,668,035 B2 | 12/2003 | Han et al. | |
| 6,970,737 B1 | 11/2005 | Brodnick et al. | |
| 6,999,014 B2 | 2/2006 | Oliaei et al. | |
| 7,018,339 B2 | 3/2006 | Birnbaum et al. | |
| 7,190,288 B2 | 3/2007 | Robinson et al. | |
| 7,245,246 B2 | 7/2007 | Ihs et al. | |
| 7,321,325 B2 | 1/2008 | Hsieh et al. | |
| RE40,424 E | 7/2008 | Han et al. | |
| 7,696,913 B2 | 4/2010 | Melanson | |
| 7,714,757 B2 | 5/2010 | Denison et al. | |
| 7,991,458 B2 | 8/2011 | Hardahl | |
| 8,164,491 B2 | 4/2012 | Cho et al. | |
| 8,193,845 B2 | 6/2012 | Jian et al. | |
| 8,204,580 B2 | 6/2012 | Kurzweil et al. | |
| 8,483,807 B2 | 7/2013 | Kurzweil et al. | |
| 8,542,138 B2 | 9/2013 | Galton et al. | |
| 8,581,763 B2 | 11/2013 | Niwa et al. | |
| 8,581,764 B2 | 11/2013 | Moue | |
| 8,598,858 B2 | 12/2013 | Kurokawa | |
| 8,755,877 B2 | 6/2014 | Zoica | |
| 8,798,725 B2 | 8/2014 | Mahmood et al. | |
| 8,842,030 B1 | 9/2014 | Fontaine et al. | |
| 8,849,381 B2 | 9/2014 | Lux et al. | |
| 9,050,007 B1 | 6/2015 | Brockway et al. | |
| 9,294,113 B2 | 3/2016 | Feizi-Khankandi et al. | |
| 9,419,642 B1 | 8/2016 | Nguyen | |
| 9,449,501 B2 | 9/2016 | Grevious et al. | |
| 9,484,950 B1 | 11/2016 | Tang | |
| 9,559,719 B1 | 1/2017 | Kauffman et al. | |
| 9,681,814 B2 | 6/2017 | Galloway et al. | |
| 9,866,227 B1 | 1/2018 | Bresciani et al. | |
| 10,110,246 B1 | 10/2018 | Zrilic | |
| 10,135,459 B2 | 11/2018 | Sharma et al. | |
| 10,284,223 B2 | 5/2019 | Ouzounov et al. | |
| 10,418,959 B2 | 9/2019 | Yuzuriha | |
| 2002/0077536 A1 | 6/2002 | Diab et al. | |
| 2003/0108143 A1 | 6/2003 | Han et al. | |
| 2003/0216906 A1 | 11/2003 | Norsworthy | |
| 2004/0171953 A1 | 9/2004 | Hemming et al. | |
| 2004/0223553 A1 | 11/2004 | Kumar | |
| 2004/0239537 A1 | 12/2004 | Mswanathan | |
| 2005/0068213 A1 | 3/2005 | Fontaine et al. | |
| 2005/0270201 A1 | 12/2005 | Maloberti et al. | |
| 2006/0229521 A1 | 10/2006 | Barr | |
| 2006/0229525 A1 | 10/2006 | Barr | |
| 2006/0235321 A1 | 10/2006 | Simske et al. | |
| 2007/0073266 A1 | 3/2007 | Chmiel et al. | |
| 2009/0021408 A1 | 1/2009 | Lee et al. | |
| 2009/0259672 A1 | 10/2009 | Garudadri et al. | |
| 2011/0050471 A1 | 3/2011 | Kumar | |
| 2011/0066053 A1 | 3/2011 | Yazicioglu | |
| 2011/0140940 A1 | 6/2011 | Cho et al. | |
| 2011/0148682 A1 * | 6/2011 | Rigby | H03M 1/188 341/155 |
| 2012/0097839 A1 | 4/2012 | Jung et al. | |
| 2012/0306689 A1 * | 12/2012 | Yule | G01S 19/27 342/357.25 |
| 2013/0050003 A1 | 2/2013 | Wang | |
| 2014/0114616 A1 | 4/2014 | Lee et al. | |
| 2014/0148714 A1 | 5/2014 | Mamaghanian et al. | |
| 2014/0163386 A1 | 6/2014 | He et al. | |
| 2014/0368366 A1 | 12/2014 | Galton et al. | |
| 2014/0375488 A1 | 12/2014 | Stoops et al. | |
| 2015/0141857 A1 | 5/2015 | Nallathambi et al. | |
| 2016/0106332 A1 | 4/2016 | Takeshima | |
| 2016/0120431 A1 | 5/2016 | Habte et al. | |
| 2016/0149586 A1 | 5/2016 | Roh et al. | |
| 2016/0322984 A1 * | 11/2016 | Sundblad | H03M 1/38 |
| 2016/0359499 A1 | 12/2016 | Bandyopadhyay | |
| 2017/0112401 A1 | 4/2017 | Rapin et al. | |
| 2018/0309460 A1 | 10/2018 | Bandyopadhyay et al. | |
| 2019/0020352 A1 | 1/2019 | Gutta et al. | |
| 2019/0199369 A1 | 6/2019 | Katayama | |
| 2019/0253069 A1 | 8/2019 | Kim et al. | |
| 2020/0001036 A1 | 1/2020 | Drakulic et al. | |

FOREIGN PATENT DOCUMENTS

| | | | |
|---|---|---|---|
| EP | 1543770 | 6/2005 | |
| EP | 2016894 | 1/2009 | |
| EP | 2589332 | 5/2013 | |
| ES | 2264871 B1 | 12/2007 | |
| WO | 2005117467 | 12/2005 | |
| WO | 2010119456 A2 | 10/2010 | |
| WO | 2021243019 * | 12/2021 | H03K 5/05 |
| WO | WO-2021243019 A1 * | 12/2021 | H03M 1/0604 |
| WO | 2022212418 A1 | 10/2022 | |

OTHER PUBLICATIONS

Agarwal, Ritika , et al., "Input-Feature Correlated Asynchronous Analog to Information Converter for ECG Monitoring", IEEE Trans. Biomed. Circuits Syst., vol. 5, No. 5, 2011, 459-467.

Aro, Aapo L., et al., "Prognostic significance of prolonged PR interval in the general population", Eur. Heart J., vol. 35, No. 2, 2013, 123-129.

Arzeno, Natalia M., et al., "Analysis of First-Derivative Based QRS Detection Algorithms", IEEE Trans. Biomed. Eng., vol. 55, No. 2, 2008, 478-484.

Assaad, Rida S., et al., "The Recycling Folded Cascode: A General Enhancement of the Folded Cascode Amplifier", IEEE J. Solid-State Circuits, vol. 44, No. 9, 2009, 2535-2542.

Bachler, Martin , et al., "Online and offline determination ofQT and PR interval and QRS duration in electrocardiography", Proc. Joint Int. Conf. Pervasive Comput. Netw. World, 2012, 1-15.

Barro, S. , et al., "Classifying multichannel ECG patterns with an adaptive neural network", IEEE Eng. Med. Biol. Mag., vol. 17, No. 1, 1998, 45-55.

Benjamin, Emelia J., et al., "Heart Disease and Stroke Statistics-2017 Update", Circulation. 2017, vol. 135, 2017, e146-e603.

Bote, Jose Manuel, et al., "A Modular Low-Complexity ECG Delineation Algorithm for Real-Time Embedded Systems", IEEE Journal of Biomedical and Health Informatics, vol. 22, No. 2, 2017, 429-441.

Cheng, Susan , et al., "Long-term Outcomes in Individuals with a Prolonged PR Interval or First-Degree Atrioventricular Block", J. Amer. Med. Assoc., vol. 301, No. 24, 2009, 2571-2577.

Chuo, Yindar , et al., "Mechanically flexible wireless multisensor platform for human physical activity and vitals monitoring", IEEE Trans. Biomed. Circuits Syst., vol. 4, No. 5, 2010, 281-294.

Comert, Zafer , et al., "Determination of QT interval on synthetic electrocardiogram", Proc. 23nd Signal Process. Commun. Appl. Conf., 2015, 2569-2572.

Ferrari, Emile , et al., "The ECG in pulmonary embolism: Predictive value of negative T waves in precordial leads-80 case reports", Chest, vol. 111, No. 3, 1997, 537-543.

Goldberger, Ary L., et al., "PhysioBank, PhysioToolkit, and PhysioNet", Circulation, vol. 101, No. 23, 2000, e215-e220.

He, David Da, et al., "A 58 nW ECG ASIC with motion-tolerant heartbeat timing extraction for wearable cardiovascular monitoring", IEEE Transactions on Biomedical Circuits and Systems, vol. 9, No. 3, 2015, 370-376.

Hou, Phan Chee, et al., "An embedded delta modulator system for coding speech signals", Proc. 2nd Int. Conf. Electron. Des., 2014, 176-180.

Hu, Qisong , et al., "Asynchronous Communication for Wireless Sensors Using Ultra Wideband Impulse Radio", IEEE 58th International Midwest Symposium on Circuits and Systems (MWSCAS), 2015, 1-4.

(56) References Cited

OTHER PUBLICATIONS

Hu, Qisong, et al., "Integrated Asynchronous Ultrawideband Impulse Radio With Intrinsic Clock and Data Recovery", IEEE Microwave and Wireless Components Letters, vol. 27, No. 4, 2017, 416-418.

Husby, Michael P., et al., "The Association between the PR Interval and Left Ventricular Measurements in the Multiethnic Study of Atherosclerosis", Cardiology Res. Practice, vol. 2015, Article ID 193698, 2015, 1-8.

Ieong, Chio-In, et al., "A 0.83-µW QRS detection processor using quadratic spline wavelet transform for wireless ECG acquisition in 0.35-µm CMOS", IEEE Trans. Biomed. Circuits Syst., vol. 6, No. 6, 2012, 586-595.

Kadambe, Shubha, et al., "Wavelet transformbased QRS complex detector", IEEE Trans. Biomed. Eng., vol. 46, No. 7, 1999, 838-848.

Khayatzadeh, Mahmood, et al., "A 0.7-V 17.4-u 3-Lead Wireless ECG SoC", IEEE Trans. Biomed. Circuits Syst., vol. 7, No. 5, 2013, 583-592.

Kim, Hyejung, et al., "Motion Artifact Removal using Cascade Adaptive Filtering for Ambulatory ECG Monitoring System", Proc. Biomed. Circuits Syst. Conf., 2012, 160-163.

Kobayashi, Takashi, et al., "Abstract 13451: Prolonged PR interval is significantly associated with increased risk of cardiovascular diseases and strokes in a population-based cohort study", Circulation, vol. 130, Suppl 2, 2014, A13451.

Krahn, Andrew D., et al., "Hysteresis of the RT interval with exercise", Circulation, vol. 96, No. 5, 1997, 1551-1556.

Laguna, P., et al., "A database for evaluation of algorithms for measurement of QT and other waveform intervals in the ECG", Proc. Comput. Cardiology, 1997, 673-676.

Laguna, Pablo, et al., "Automatic Detection of Wave Boundaries in Multilead ECG Signals: Validation With the CSE Database", Comput. Biomed. Res., vol. 27, No. 1, 1994, 45-60.

Li, Pengfei, et al., "High-Performance Personalized Heartbeat Classification Model for Long-Term ECG Signal", IEEE Transactions on Biomedical Engineering, vol. 64, No. 1, 2017, 78-86.

Lin, Chao, et al., "P- and T-Wave Delineation in ECG Signals Using a Bayesian Approach and a Partially Collapsed Gibbs Sampler", IEEE Trans. Biomed. Eng., vol. 57, No. 12, 2010, 2840-2849.

Liseth, Olav E., et al., "Power-efficient cross-correlation beat detection in electrocardiogram analysis using bitstreams", IEEE Trans. Biomed. Circuits Syst., vol. 4, No. 6, 2010, 419-425.

Liu, Xin, et al., "A 457 nW Near-Threshold Cognitive Multi-Functional ECG Processor for Long-Term Cardiac Monitoring", IEEE Journal of Solid-State Circuits, vol. 49, No. 11, 2014, 2422-2434.

Martinez, Juan Pablo, et al., "A Wavelet-Based ECG Delineator: Evaluation on Standard Databases", IEEE Trans. Biomed. Eng., vol. 51, No. 4, 2004, 570-581.

Moody, George B., et al., "The Impact of the MIT-BIH Arrhythmia Database", IEEE Eng. Med. Biol. Mag., vol. 20, No. 3, 2001, 45-50.

Morita, Hiroshi, et al., "The QT syndromes: long and short", Lancet, vol. 372, No. 9640, 2008, 750-763.

Nallathambi, Gabriel, et al., "Integrate and Fire Pulse Train Automaton for QRS detection", IEEE Trans. Biomed. Eng., vol. 61, No. 2, 2014, 317-326.

Pipberger, Hubert V., et al., "The P wave, PR interval, and QT ratio of the normal orthogonal electrocardiogram", Circulation, vol. 18, No. 6, 1958, 1175-1180.

Porta, A., et al., "Performance assessment of standard algorithms for dynamic RT interval measurement: Comparison between RT apex and RT end approach", Med. Biol. Eng. Comput., vol. 36, No. 1, 1998, 35-42.

Qian, Chengliang, et al., "A Low-Power Configurable Neural Recording System for Epileptic Seizure Detection", IEEE Trans. Biomed. Circuits Syst., vol. 7, No. 4, 2013, 499-512.

Ravanshad, Nassim, et al., "An event-based ECGmonitoring and QRS-detection system based on level-crossing sampling", Proc. 2017 Iranian Conf. Electr. Eng., 2017, 302-307.

Rincon, Francisco, et al., "Development and Evaluation of Multilead Wavelet-Based ECG Delineation Algorithms for Embedded Wireless Sensor Nodes", IEEE Trans. Inf. Technol. Biomed., vol. 15, No. 6, 2011, 854-863.

Roh, Hyungdong, et al., "A 0.6-V Delta-Sigma Modulator With Subthreshold-Leakage Suppression Switches", IEEE Trans. Circuits Syst. II, Exp. Briefs, vol. 56, No. 11, 2009, 825-829.

Roh, Jeongjin, et al., "A 0.9-V 60- uW 1-bit fourth-order delta-sigma modulator with 83-dB dynamic range", IEEE J. Solid-State Circuits, vol. 43, No. 2, 2008, 361-370.

Roten, Laurent, et al., "Is 7-day event triggered ECG recording equivalent to 7-day Holter ECG recording for atrial fibrillation screening?", Heart, vol. 98, 2012, 645-649.

Sai, Vyasa, et al., "Exploring Energy Efficient Architectures in Passive Wireless Nodes for IoT Applications", IEEE Circuits and Systems Magazine, vol. 14, Vo. 2, 2014, 48-54.

Sayadi, Omid, et al., "Model-Based ECG Fiducial Points Extraction Using a Modified Extended Kalman Filter Structure", Proc. First Int. Symp. Appl. Sci. Biomed. Commun. Technol., 2008, 1-5.

Speranza, G., et al., "Beat-to-beat measurement and analysis of the RT interval in 24 h ECG Holter recordings", Med. Biol. Eng. Comput., vol. 31, No. 5, 1993, 487-494.

Strumillo, P., "Nested median filtering for detecting T-wave offset in ECGs", Electronics Letters, vol. 38, No. 14, 2002, 682-683.

Sze, Vivienne, et al., "Hardware for Machine Learning: Challenges and Opportunities", arXiv:1612.07625v5, 2017, 1-9.

Tang, X., et al., "A RealTime QRS Detection System With PR/RT Interval and ST Segment Measurements for Wearable ECG Sensors Using Parallel Delta Modulators", IEEE Transactions on Biomedical Circuits and Systems, vol. 12, No. 4, 2018, 751-761.

Tang, Xiaochen, et al., "Analog to Digital Feature Converter based on Oversampling Modulators for ECG Delineation", IEEE 62nd International Midwest Symposium on Circuits and Systems (MWSCAS), 2019, 121-124.

"AD7398/7399 Quad, Serial Input 12-Bit/10Bit DAC's", Analog Devices, Tech. Rep, 2011.

"AD7401 Isolated Sigma-Delta Modulator", Analog Devices, Tech. Rep., 2011.

"ADS131E04 Analog Front-End for Power Monitoring, Control and Protection", Texas Instruments, Tech. Rep, 2013.

"Opal Kelly XEM 3001 User's Manual", Opal Kelly Incorporated, 2004.

Andersson, Mattias, "Continuous-Time Delta-Sigma Modulators for Wireless Communication", Lund Institute of Technology, 2014.

Cherry, James A, et al., "Continuous-Time Delta-Sigma Modulators for High-Speed A/D Conversion", Kluwer Academic Publishers, 2002.

Dias, Victor Da Fonte, "Signal Processing in the Sigma-Delta Domain", Microelectronics Journal, 1995, 543-562.

Fujisaka, Hisato, et al., "Bit-Stream Signal Processing and its Application to Communication Systems", Circuits, Devices and Systems, 2002, 159-166.

Fujisaka, Hisato, et al., "Sequence Characteristics of Multi-Level and Second-Order Sigma-Delta Modulated Signals", Nonlinear Theory and Its Applications, IEICE, Jul. 1, 2013, 313-339.

Fujisaka, Hisato, et al., "Sorter-Based Arithmetic Circuits for Sigma-Delta Domain Signal Processing—Part II: Multiplication and Algebraic Functions", Transactions on Circuits and Systems I: Regular Papers, IEEE, Sep. 2012, 1966-1979.

Fujisaka, Hisato, et al., "Sorter-Based Arithmetic Circuits for Sigma-Delta Domain Signal Processing-Part I; Addition, Approximate Transcendental Functions, and Log-Domain Operations", Transactions on Circuits and Systems I: Regular Papers, IEEE, Sep. 2012, 1952-1965.

Hafshejani, E. H., et al., "A lowpower signal-dependent sampling technique: Analysis, implementation, and applications", IEEE Transactions on Circuits and Systems I: Regular Papers, vol. 67, No. 12, 2020, 4334-4347.

Hafshejani, E. H., et al., "Self-aware data processing for power saving in resource-contrained iot cyberphysical systems", IEEE Sensors Journal. Vol. 22, No. 4, 2021, 3648-3659.

Hidaka, Yuji, et al., "Piecewise Linear Operations on Sigma-Delta Modulated Signals", vol. 3, 2002, 983-986.

(56) References Cited

OTHER PUBLICATIONS

Horianopoulos, S. , et al., "Design Technique for Hardware Reduction in Delta Modulation FIR Filters", International Journal of Electronics, 1991, 93-106.
Johns, David A, et al., "Design and Analysis of Delta-Sigma Based IIR Filters", IEEE Transactions on Circuits and Systems-II: Analog and Digital Signal Processing, Apr. 1993, 233.
Katao, Tsubasa , et al., "Single-Electron Arithmetic Circuits for Sigma-Delta Domain Signal Processing", Nanotechnology NANO 2008. 8th IEEE Conference on Aug. 2008, 2008, 729-732.
Konstantinides, K. , et al., "An architecture for lossy compression of waveforms using piecewise-linear approximation", IEEE Transactions on Signal Processing, Vo. 42, No. 9, 1994, 2449-2454.
Kouvaras, N. , et al., "A Technique for a Substantial Reduction of the Quantization Noise in the Direct Processing of Delta-Modulated Signals", Signal Processing, 1985, 107-119.
Kouvaras, N. , "Modular network for direct complete addition of delta-modulated signals with minimum quantization error", Int. J. Electronics, 1985, 587-595.
Kouvaras, N. , "Operations on Delta-Modulated Signals and Their Application in the Realization of Digital Filters", Radio and Electronic Engineer, Sep. 1978, 431-438.
Kouvaras, N. , "Some Novel Elements for Delta-Modulated Signal Processing", Radio and Electronic Engineer, May 1981, 241-250.
Lee, Ho-Yin , et al., "Designing Low Power of Sigma Delta Modulator for Biomedical Application, Biomedical Enginnering Applicatons, Basis & Communications", Biomed, Eng. Appl. Basis Commun., vol. 17, 2005, 181-185.
Li, Y. , et al., "A sub-microwatt Asynchronous level-crossing adc for biomedical applications", IEEE Transactions on Biomedical Circuits and Systems, vol. 7, No. 2, 2013, 149-157.
Li, Bingxin , "Design of Multi-bit Sigma-Delta Modulators for Digital Wireless Communications", Kungl Royal Institute of Technology Department of Microelectronics & Information Technology, 2003.
Liang, Y. , et al., "Design of High Speed High SNR Bit-Stream Adder Based on Delta-Sigma Modulation", Electronics Letters, May 2010, 752-753.
Liu, Yifei , et al., "Hardware-Efficient Delta Sigma-Based Digital Signal Processing Circuits for the Internet-of-Things", Journal of Low Power Electronics and Applications, vol. 5, 2015, 234-256.
Mafi, H. , et al., "Digital calibration of elements mismatch in multirate predictive sar adcs", IEEE Transactions on Circuits and Systems I: Regular Papers, vol. 6, No. 12, 2019, 4571-4581.
Matsuyama, Kazutoshi , et al., "Arithmetic and Piecewise Linear Circuits for Sigma-Delta Domain Multi-Level Signal Processing", International Symposium on Nonlinear Theory and its Applications. (NOLTA 2005), Oct. 2005, 58-61.
Moule, Eric C, et al., "Blue-Noise Sigma-Delta Modulator: Improving Substrate Noise and Nonlinear Amplifier Gain Effects", Dept. of Electrical and Computer Engineering University of Rochester Rochester, NY USA, May 27, 2007.
Ng, Chiu-Wa , et al., "Bit-Stream Adders and Multipliers for Tri-Level Sigma-Delta Modulators", Transactions on Circuits and Systems II: Express Briefs, IEEE, Dec. 2007, 1082-1086.
O'Leary, P., et al., "Bit Stream Adder for Oversampling Coded Data", Joanneum Research, Aug. 6, 1990.
Park, Sangil , "Principles of Sigma-Delta Modulation for Analog-to-Digital Converters", Motorola Digital Signal Processors, 1990.
Pavan, Shanthi , et al., "A Power Optimized Continuous-Time $\Delta\sigma$ ADC for Audio Applications", IEEE Journal of Solid-State Circuits, Feb. 2008.
Pneumatikakis, A. , et al., "Realization of a high-order IIR delta signma filter", Int. J. Electronics, 1995, 1071-1089.
Ravenshad, N. , et al., "A level-crossing based qrs-detection algorithm for wearable ecg sensors", IEEE Journal of Biomedical and Health Informatics, vol. 18, No. 1, 2014, 183-192.
Schell, B. , et al., "A continuous-time ADC/DSP/DAC System with no Clock and with Activity-Dependent Power Dissipation", IEEE Journal of Solid-State Circuits, vol. 43, No. 11, 2008, 2472-2481.

Schreier, Richard , "Delta Sigma Toolbox", http://www.mathwords.com/matlabcentral/fileexchange/19-delta-sigma toolbox, Dec. 2011.
Tang, X. , et al., "A real-time arrhymia heartbeats classification algorithm using parallel delta modulations and rotated linear-kernel support vector machines", IEEE Transactions on Biomedical Engineering, vol. 67, No. 4, 2020, 978-986.
Tang, Xiaochen , et al., "A Real-Time QRS Detection System with PR/RT interval and ST Segment Measurements for Wearable ECG Sensors Using Parallel Delta Modulators", IEEE Transactions on Biomedical Circuits and Systems, vol. 12, No. 4, May 7, 2018, 751-761.
Tang, W. , et al., "Continuous Time Level Crossing Sampling ADC for Bio-potential Recording Systems", IEEE Transactions on Circuits and Systems I: Regular Papers, vol. 60, No. 6, 2013, 1407-1418.
Tang, X. , et al., "Delta Sigma Encoder for LowPower Wireless Bio-Sensors Using Ultrawideband Impulse Radio", IEEE Transactions on Circuits and Systems II: Express Briefs, vol. 64, No. 7, 2017, 747-751.
Tang, Wei , "Hardware Efficient Digital Signal Processing Methods for Implementation of On-the Fly Delta Sigma Adder and Compressor Circuits", Klipsch School of Electrical and Computer Engineering, New Mexico State University wtang@nmsu.edu.
Weltin-Wu, C. , et al., "An event-driven clockless level-crossing adc with signal dependent adaptive resolution", IEEE Journal of Solid-State Circuits, vol. 48, No. 9, 2013, 2180-2190.
Yoo, Jerald , et al., "An 8-Channel Scalable EEG Acquisition SoC with Fully Integrated Patient-Specific Seizure Classification and Recording Processor", Solid-State Circuits Conference Digest of Technical Papers (ISSCC) IEEE International, Feb. 2012, 292-294.
Yoo, Jerald , et al., "An 8-Channel Scalable EEG Acquisition SoC with Patient-Specific Seizure Classification and Recording Processor", Solid-State Circuits, IEEE Journal, Jan. 2013, 214-228.
Zhang, X. , et al., "A 2.89- µ W Dry-Electrode Enabled Clockless Wireless ECG SoC for Wearable Applications", IEEE Journal of Solid-State Circuits, vol. 51, No. 10, 2016, 2287-2298.
Thomas, Julien , et al., "A multi-HMM approach to ECG segmentation", Proc. 18th IEEE Int. Conf. Tools Artif. Intell., 2006, 609-616.
Vila, Jose Antonio, et al., "A New Approach for TU Complex Characterization", IEEE Trans. Biomed. Eng., vol. 47, No. 6, 2000, 764-772.
Wescott, Tim , "Sampling: What Nyquist Didn't Say, and What to Do About It", Wescott Des. Serv., Oregon, OR, USA, Tech. Rep., 2015, 1-27.
Xu, Sean Shensheng, et al., "Towards End-to-End ECG Classification With Raw Signal Extraction and Deep Neural Networks", IEEE journal of biomedical and health informatics, vol. 23, No. 4, 2019, 1574-1584.
Yamaguchi, Masato , et al., "T wave peak-to-end interval and QT dispersion in acquired long QT syndrome: A new index for arrhythmogenicity", Clin. Sci., vol. 105, No. 6, 2003, 671-676.
Yetman, Anji T., et al., "Long-term Outcome and Prognostic Determinants in Children With Hypertrophic Cardiomyopathy", J. Amer. College Cardiology, vol. 32, No. 7, 1998, 1943-1950.
Yin, Shihui , et al., "A 1.06 µw smart ecg processor in 65 nm cmos for real-time biometric authentication and personal cardiac monitoring", 2017 Symposium on VLSI Circuits, 2017, C102-C103.
Yu, Hang , et al., "A Two-Step Prediction ADC Architecture for Integrated Low Power Image Sensors", IEEE Transactions on Circuits and Systems I: Regular Papers, vol. 64, No. 1, 2017, 50-60.
Zhang, Xiaoyang , et al., "A 300-mV 220-nW Event-Driven ADC With Real-Time QRS Detection forWearable ECG Sensors", IEEE Trans. Biomed. Circuits Syst., vol. 8, No. 6, 2014, 834-843.
Hsu, et al., "A 1V Low Power Second-Order Delta-Sigma Modulator for Biomedical Signal Application", 35 Annual International Conference of the IEEE EMBS, Osaka, Japan, 2013, 2008-2011.
Pablo, et al., "Low Noise Front-End and ADC for Real-Time ECG System in CMOS Process", IEEE 10th Latin American Symposium on Circuits & Systems (LASCAS), 2019, 1-4.

\* cited by examiner

DAC-based Predictive Sampling System

ADC-based Predictive Sampling System

DYNAMIC PREDICTIVE SAMPLING AND PROCESSING

CROSS-REFERENCE TO RELATED APPLICATIONS

This application claims priority to and the benefit of the filing of U.S. Provisional Patent Application No. 63/354,511, entitled "Method and Apparatus for Dynamic Predictive Sampling and Processing", filed on Jun. 22, 2022, and the specification and proposed claims thereof are incorporated herein by reference.

STATEMENT REGARDING FEDERALLY SPONSORED RESEARCH OR DEVELOPMENT

This invention was made with government support under contract number 2015573 awarded by The National Science Foundation. The government has certain rights in the invention.

BACKGROUND OF THE INVENTION

Embodiments of the present invention relate to the field of analog and digital signal processing. More particularly, embodiments of the present invention relate to a method and apparatus for selecting key sampling points in continuous-time signal processing.

Linear prediction has been widely used in digital signal processing. It has not been commonly applied in real-time sensing because of the lack of low-complexity circuits. In a special case of linear prediction processing, the first-order level-crossing sampling method can be achieved using low-complexity circuits, which makes it popular in sensing technologies. However, the first order level-crossing sampling cannot detect fiducial points of the input signal during the sensing process. The first-order level-crossing sampling also generates many unnecessary sampling points which increase the workload of the following digital signal processing units.

Low-power sensing hardware and algorithms for data acquisition systems are critical for wearable and miniaturized devices and have been actively studied. A primary goal is to convert the input analog signal into a digital signal while extracting the critical information from the input signal and avoiding unnecessary data generated from the conventional Nyquist sampling. The most popular solution is the first-order level-crossing sampling technique that samples using amplitude thresholds instead of a constant clock. If the input analog signal's amplitude variation is below a certain threshold, no sampling and digital quantization are performed. This is an efficient method to save power and sampling data when the input signal is sparse in the time domain. However, the first-order level-crossing sampling technique is susceptible to high-amplitude low-frequency baseline wandering and low-amplitude high-frequency noise. In these two cases, the first-order level-crossing sampling may generate many unnecessary samplings. Moreover, the first-order level-crossing sampling is not able to identify the turning points (fiducial points) of the input signal because it is only sensitive to the slope but not the slope variation.

A second sensing method that can detect slope variation and fiducial points is the second-order delta modulation. The second-order delta modulation converts the input analog signal into a digital pulse stream, whose pulse density is proportional to the input slope variation. Although it can be produced in a low power circuit configuration, this method is also susceptible to high frequency noise. A third candidate is a slope-tracking method that only samples the signal when the slope prediction is incorrect. However, if the input signal's slope is varying slowly in one direction, this method may introduce accumulated errors due to unnecessarily discarding sampling points. In addition, this method involves complicated circuit structures to calculate divisions for obtaining the slope data. The tolerance of noise in the waveform is also a problem in the slope tracking method.

Another related method is piece-wise linear transformation, which seeks to use a minimum number of piece-wise linear waveforms to represent the input. The primary goal is to achieve data compression. However, the traditional piece-wise linear transform methods require the collection of all the input data to form the error channel. The searching method has high computing overhead, this renders it not suitable to be applied for low-power sensors running for real-time applications. To remedy this, in one embodiment, we apply a prediction analog-to-digital converter ("ADC") to the time domain in order to achieve data and power reduction as well as feature extraction during data conversion.

In light of the foregoing deficiencies of the known methods and systems, there is thus a present need for an alternative method using a second-order level-crossing sampling that can detect the fiducial points, which are the key sampling points, of the input signal while it does not increase the circuit complexity. There is further a need for a second-order level-crossing sampling method can be applied for both fiducial point detection and data compression simultaneously during the sensing process, which can provide desirable results for wearable and miniaturized sensing devices with limited battery power.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention.

BRIEF SUMMARY OF EMBODIMENTS OF THE PRESENT INVENTION

Embodiments of the present invention relate to an electrical signal processing apparatus including a digital dynamic predictive sampling system configured to predict a digital value of an incoming analog sampling value, and an analog sampling and quantization circuit. The digital dynamic predictive sampling system can be configured to provide digital feedback to the analog sampling circuit. The electrical signal processing apparatus can be configured to generate a digital data output and a digital timestamp output from an analog input signal and a pre-defined delta step value. The digital dynamic predictive sampling system can be configured to take two digital sampling values and calculate the predicted value of a next sampling using linear prediction. The digital dynamic predictive system can be configured to perform full analog to digital conversions for two samples and calculate a predicted value of a next sampling using linear prediction. Optionally, the electrical signal processing apparatus can be configured to calculate two thresholds by adding and subtracting the predicted value by a delta step value, and the two thresholds respectively can comprise an upper threshold digital value and a lower threshold digital value. The electrical signal processing apparatus can be configured to start a comparing process when a new sampling value is compared with the two thresholds if the new sampling value is between the upper threshold and the lower threshold, and wherein when the prediction is considered successful, the predicted value and the last sampling value are applied to calculate a next predicted value.

In one embodiment, the electrical signal processing apparatus can be configured to initiate a recording process when a new sampling value is not between the upper threshold and the lower threshold. The electrical signal processing apparatus can be configured to record a current sampling digital value, and/or can be configured to perform a full analog to digital conversion and record a value. The recorded value can be a digital data output. The electrical signal processing apparatus can be configured to initiate a subsequent prediction process after the value is recorded. Optionally, the electrical signal processing apparatus can include a digital timer with a reset value of zero, and the digital timer can be configured to start counting a number of clock cycles when a recording process begins. The electrical signal processing apparatus can be configured to record a digital timer value. The digital timer recorded value can be used as a timestamp output of the electrical signal processing apparatus and the digital timer can be reset to zero and configured to begin counting until a subsequent recording process.

In one embodiment, the electrical signal processing apparatus can be configured to apply a neighbor amplitude filter after the dynamic predictive sampling system to remove samples in an episode of low-amplitude high-frequency noise. The neighbor amplitude filter can be configured to set a protection window for a starting sampling point with a predetermined time and amplitude and remove other sampling points after the starting sampling point when the other sampling points are within a window, but not if one or more of the other sampling points have an amplitude difference that is higher than a user-defined value. After stopping, the neighbor amplitude filter can optionally be configured to then search for a next starting sampling point.

A slope filter can be applied after the dynamic predictive sampling system and the slope filter can be configured to remove samplings in a high-amplitude low-frequency baseline wandering. The slope filter can be configured to calculate slopes of specific sampling points with their prior and later sampling points and the specific sampling points can be sampling points whose amplitudes are not maximum or minimum values in the original waveform. Optionally, the slope filter can be configured such that if a relative difference between a prior slope and a later slope is lower than a slope threshold, the sampling point is removed. The electrical signal processing apparatus can be configured such that a larger slope threshold removes more sampling points than is the case for a slope threshold that is smaller, at a cost of a higher distortion of a final piece-wise linear waveform compared to an original waveform.

The electrical signal processing apparatus can be formed into an integrated circuit and the digital dynamic predictive sampling system can include a block of the integrated circuit. The electrical signal processing apparatus can include or otherwise be a digital signal processing apparatus. The electrical signal processing apparatus can include or otherwise be an analog signal processing apparatus.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

Figure 1A:
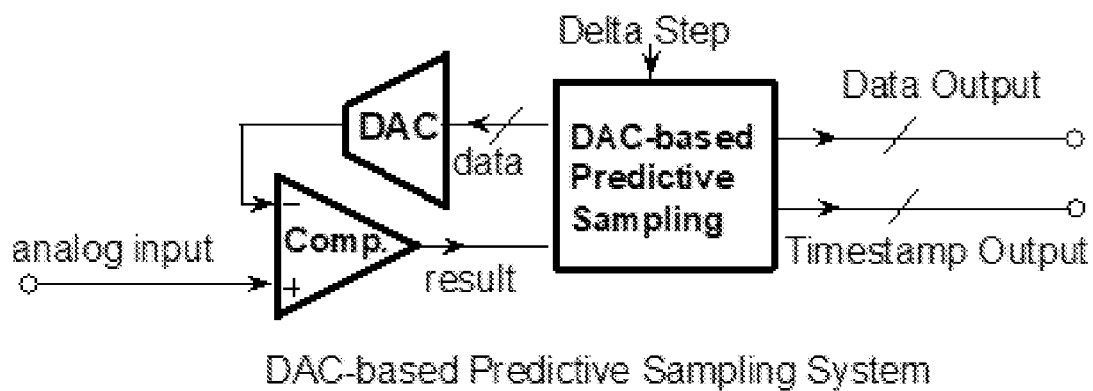
FIG. 1A is a drawing which illustrates a predictive sampling system which is based on a digital-to-analog converter according to embodiments of the present invention.
Figure 1B:
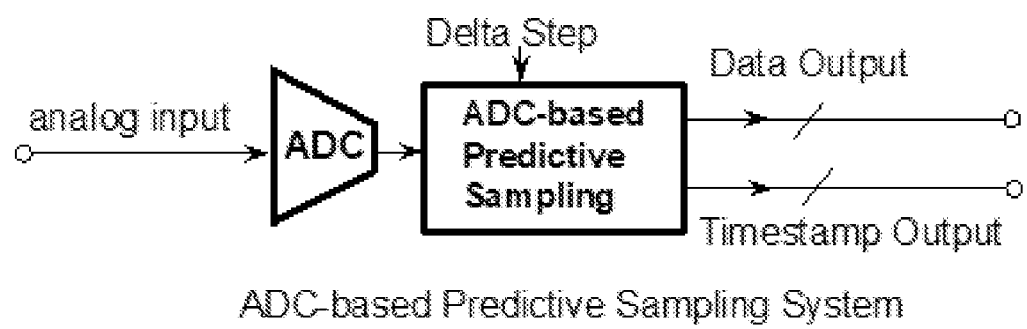
FIG. 1B is a drawing which illustrates a predictive sampling system that is based on an analog-to-digital converter according to embodiments of the present invention.

Embodiments of the present invention relate to a method and apparatus for timing values and amplitude values of key sampling points of the input analog signal and which preferably records the values into a digital format in real-time during the sensing process. The apparatus preferably uses a time-domain dynamic predictive sampling method that is based on a second order level-crossing sampling method to alleviate the effects of high-amplitude low-frequency baseline wandering and low-amplitude high-frequency noise in the input signal. The apparatus can be achieved following either an ADC or a digital-to-analog converter ("DAC") with a comparator, as illustrated in FIGS. 1A and 1B.

When using DACs, the input analog signal is compared to two thresholds that are generated by a predicted value and a delta step. If the prediction is incorrect, which means the input analog waveform is higher than the upper threshold or lower than the lower threshold, two consecutive samplings are preferably performed at the typical rate of the sampling clock, each sampling is followed by an analog-to-digital conversion. The two converted digital values are obtained for generating a new digital prediction. In other words, the digital prediction of the next input analog value is preferably first calculated digitally using the digital values from the prior two samples. Specifically, the digital prediction value is preferably calculated using twice the digital value of the last sampling minus the digital value of the second last sampling as illustrated in Equation 1.

Predicted Digital Value=2×Last Sample Digital Value−Second Last Sample Digital Value  Equation 1:

In binary data, multiplying by two can be achieved using left shift of the bits of the digital values, implementation of Equation 1 does not involve an actual multiplication operation. The predicted value is then applied to generate the upper and lower threshold values using Equations 2 and 3

Upper Threshold Digital Value=Predicted Digital Value+Delta Step  Equation 2:

Lower Threshold Digital Value=Predicted Digital Value−Delta Step  Equation 3:

The upper and lower threshold values are preferably then converted into analog values using digital to analog conversion. The analog values of the thresholds are preferably compared with the actual analog input value in the next sampling. Analog comparisons are preferably made between the analog input signal, the upper threshold value, and the lower threshold value using one or more comparators. The comparison results decide if the analog input signal is between the upper threshold value and the lower threshold value based on Equation 4.

Lower Threshold Value<Input Signal Value<Upper Threshold Value  Equation 4:

If the input analog value is between the two thresholds, i.e., Equation 4 is valid, the prediction is correct and no analog to digital conversion is performed for the input analog signal, so no data is recorded or sent as an output of the system. The next "last sample digital value" is preferably then replaced by the current "predicted digital value" while the "second last sample digital value" is replaced by the current "last sample digital value." Then the next predicted digital value is preferably calculated using Equation 1.

If the input analog value is not between the two thresholds, i.e., Equation 4 is invalid, the prediction is incorrect. This means the input analog waveform is higher than the upper threshold or lower than the lower threshold, in which case, the method/apparatus then preferably performs two full analog-to-digital conversions of the input analog signal to generate new digital values.

Figure 2:
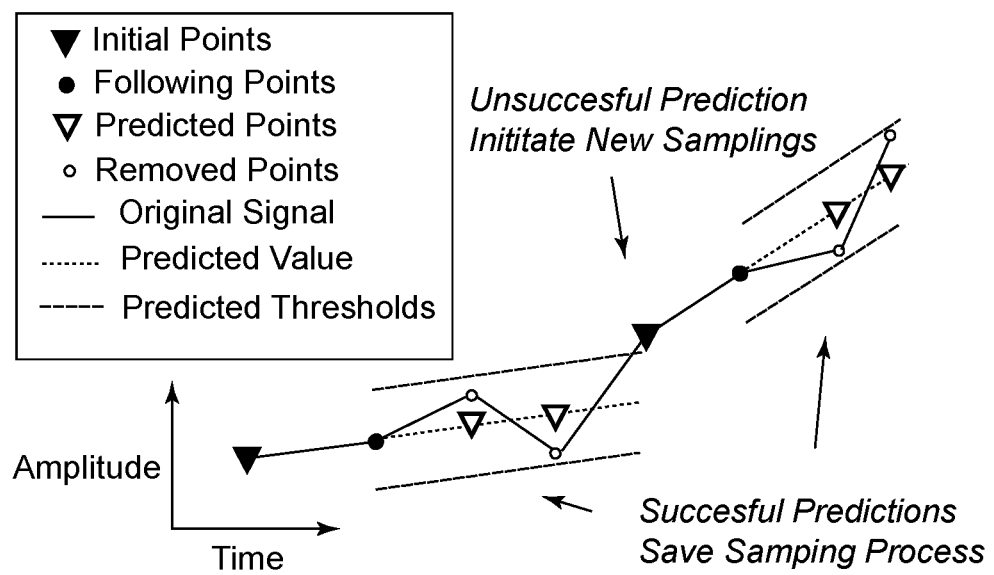
FIG. 2 is an amplitude vs time chart which illustrates dynamic predictive sampling of a waveform according to an embodiment of the present invention.
Figure 3:
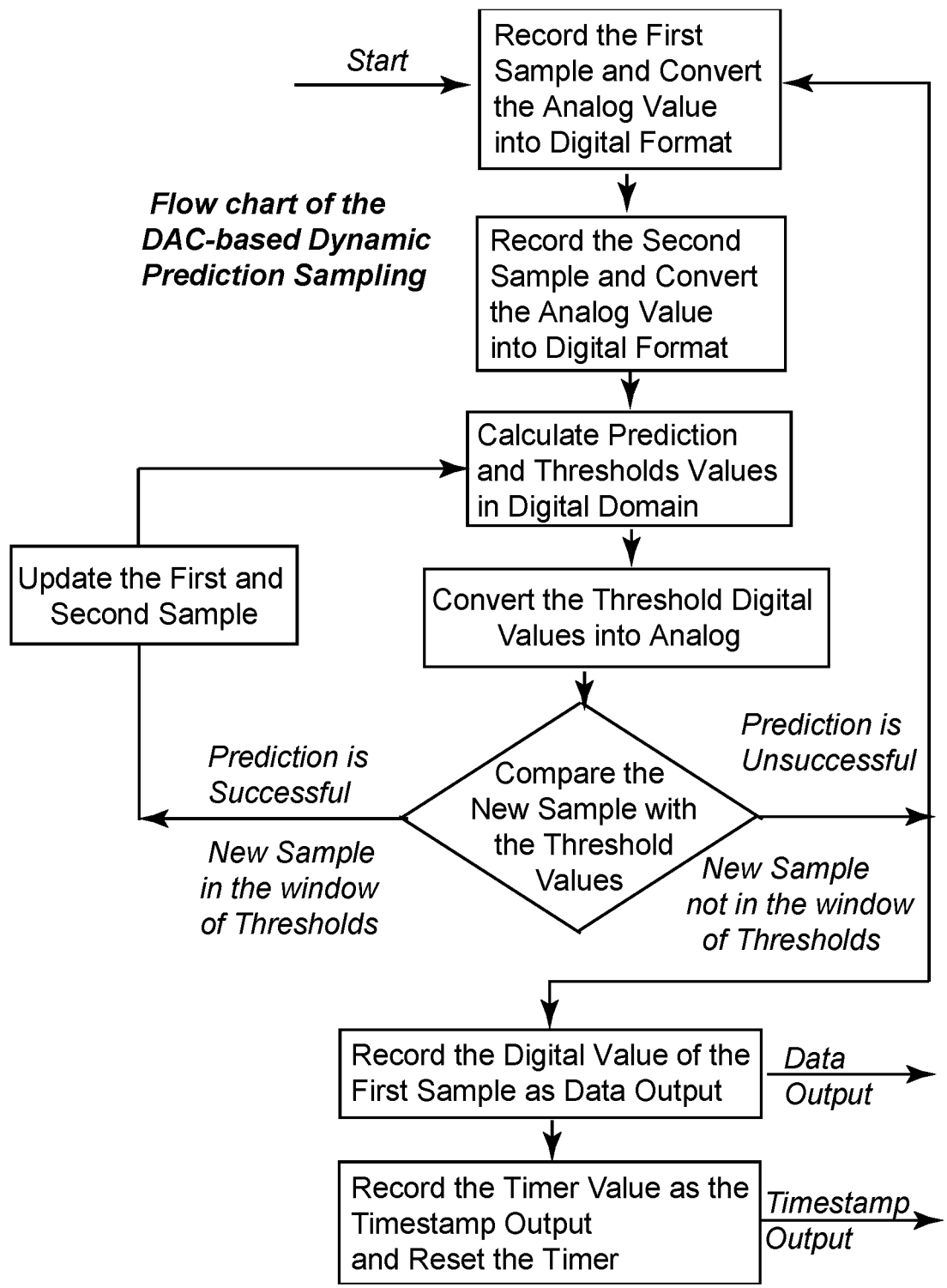
FIG. 3 is a drawing which illustrates a flowchart of logic for a dynamic predictive sampling method that is based on a digital-to-analog converter according to an embodiment of the present invention.
Figure 4:
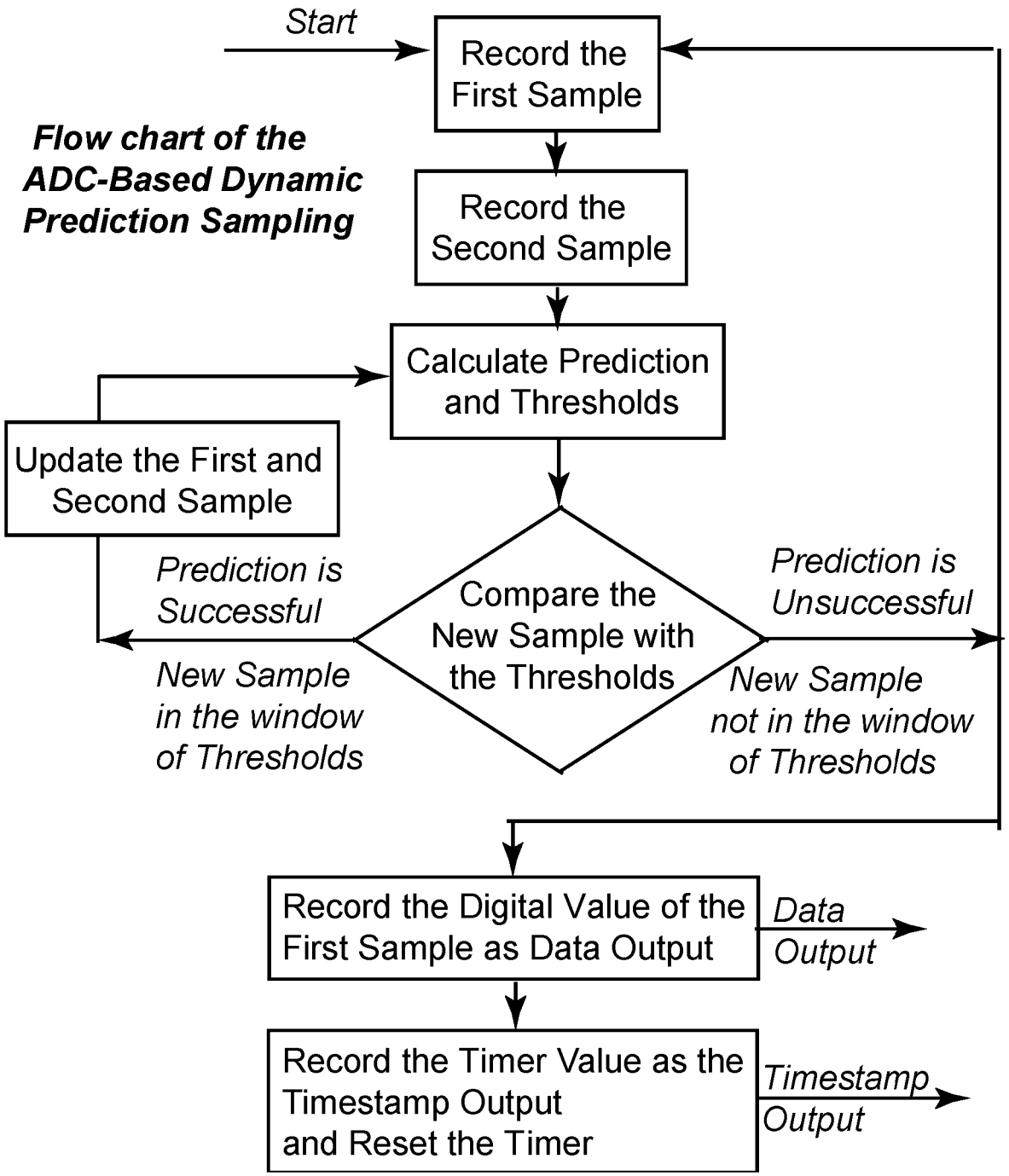
FIG. 4 is a drawing which illustrates a flowchart of logic for a dynamic predictive sampling method that is based on an analog-to-digital converter according to an embodiment of the present invention.

The two digital values are temporarily stored and applied as the last sample digital value and the second last sample digital values. Then, the next predicted digital value is preferably calculated using Equation 1. An example waveform showing the dynamic predictive sampling is illustrated in FIG. 2. A typical algorithm of dynamic predictive sampling using DACs is illustrated in FIG. 3. The system can also be achieved using an ADC. In an ADC-based second-order level-crossing system, the ADC preferably samples at a fixed sampling rate. The digital value of each sampling is preferably processed by the second-order level-crossing sampling in a complete digital domain. When the process starts, the first two digital values are used as the last sample digital value and the second last sample digital value. The upper and lower thresholds are then calculated using Equation 2. The difference between the ADC-based system and the DAC-based system is that in the ADC-based system, the digital values of the upper and lower thresholds are not converted into analog, therefore equation 3 can be skipped. The comparison is preferably performed in the digital domain using Equation 4.

Where the input digital signal value is obtained directly from the ADC, if the prediction is successful, i.e., equation 4 is valid, the next "last sample digital value" is then replaced by the current "predicted digital value" while the "second last sample digital value" is replaced by the current "last sample digital value". If, however, the prediction is not successful, this means the input digital value is higher than the upper threshold digital value or lower than the lower threshold digital value. In this case, two digital values are preferably recorded for the next two samplings. The two digital values are temporarily stored and applied as the last sample digital value and the second last sample digital value. A typical algorithm of dynamic predictive sampling using an ADC is illustrated in FIG. 4.

In one embodiment, the current sample value is preferably sent as an output of the system. A clock starts counting the time stamp between the timing of the current sample value and the next time when a prediction is incorrect. The timestamp is preferably also an output of the system.

The main difference between the second-order level-crossing sampling and the first-order level-crossing sampling is that in the second-order level-crossing sampling, the thresholds are updated after every sample using two prior sampling values. Even if the prediction is successful, the threshold value changes over time and tracks the input analog slope. While in the first-order level-crossing sampling, the thresholds are calculated using only one sampling value while the thresholds are constants over time if the prediction is successful.

Using the second-order level-crossing sampling, the system preferably achieves a low computing overhead by removing multiplication—this is because multiplying by 2 can be realized using shift registers. Also, the calculation of predictive value and thresholds are performed in the digital domain, which reduces the noise effects of the analog circuitry. Moreover, embodiments of the present invention provide a guaranteed maximum error that avoids the accumulated errors introduced by small slope variations using the signal depending sampling method. The delta step in the second-order level-crossing sampling can also be adjusted digitally.

The two primary challenges for predictive samplings are low-amplitude high-frequency noise and high-amplitude low-frequency baseline wandering. In order to use the minimum number of samples to form the piece-wise linear waveform, two types of filters can be applied to remove the unnecessary samples. One is a neighbor amplitude filter to remove samples in an episode of low-amplitude high-frequency noise and the other is a slope filter to remove samples in a high-amplitude low-frequency baseline wandering.

Figure 5A:
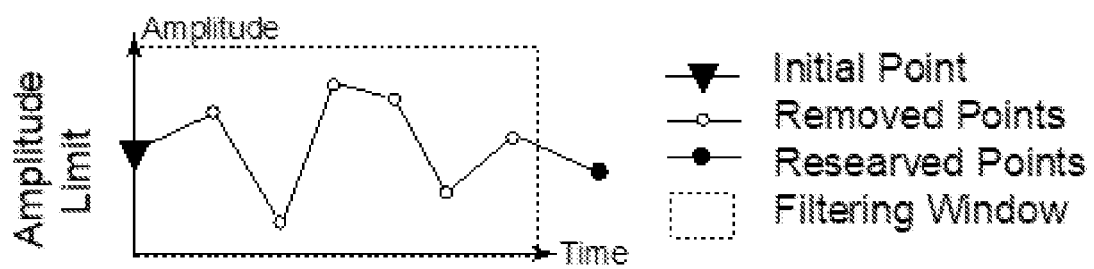
FIGS. 5A, 5B and 5C are a series of graphs which illustrate the waveform of a neighbor amplitude filter algorithm and an example where the filter window ends early according to an embodiment of the present invention.
Figure 5B:
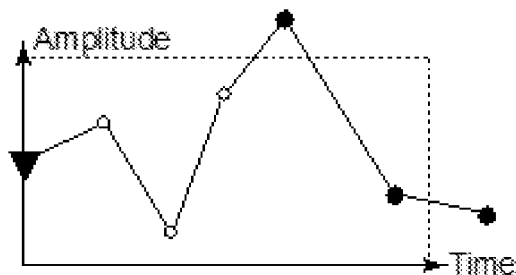
Figure 5C:
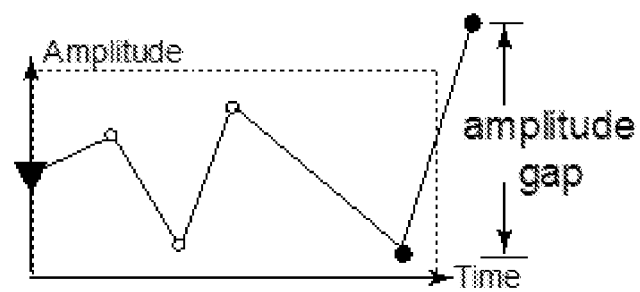
Figure 6:
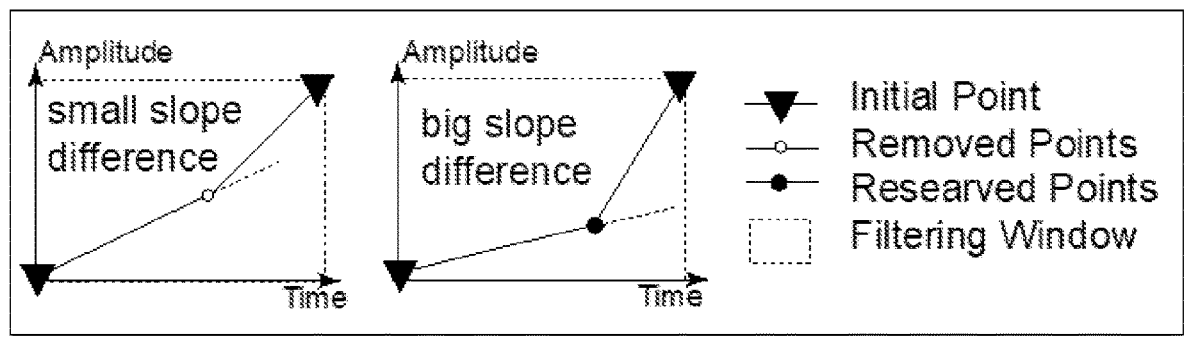
FIG. 6 is a drawing which illustrates a pair of graphs of slop filters for methods that are based on a small slope difference (left graph) and a large slope difference (right graph) according to an embodiment of the present invention.

The neighbor amplitude filter removes sampling points that are too close to its neighboring sampling points in both time and amplitude. A protection window for a starting sampling point is preferably set with a predetermined time and amplitude to identify other sampling points after the starting point within the window. The selection of the window size in both time and amplitude depends on the specific type of signal and application. A larger window can achieve a higher compression ratio with a cost of lower accuracy. All the other sampling points after the starting point that are located within the window are removed. An "exception" is if a sampling point has a high amplitude difference compared to its consecutive sampling point. All other sampling points after such a "different point" are preserved and the neighbor amplitude filter stops for the starting sampling point. The neighbor amplitude filter preferably then searches for the next starting sampling point, as illustrated in the graphs of FIGS. 5A, 5B and 5C. The slope filter calculates the slopes of certain sampling points with their prior and later sampling points. If the relative difference between the prior slope and the later slope is lower than a slope threshold, this sampling point can be removed, as illustrated in FIG. 6.

Because the neighbor amplitude filter and slope filter can be cascaded in the system, each time a new filter is applied, the time stamp is preferably re-calculated using the sampling points that were dropped from the filter. Both timestamp data and the amplitude data of the selected sampling points from the original input waveform are preferably applied for further processing or reconstruction.

In the case of reconstruction, the selected sampling points are preferably connected using a first-order approximation to form a piece-wise linear waveform. In many data acquisition applications that involve time-series signals (for example biomedical, speech, and audio signal processing), the original analog waveform can be simplified into a piece-wise-linear waveform without losing key information.

Figure 7A:
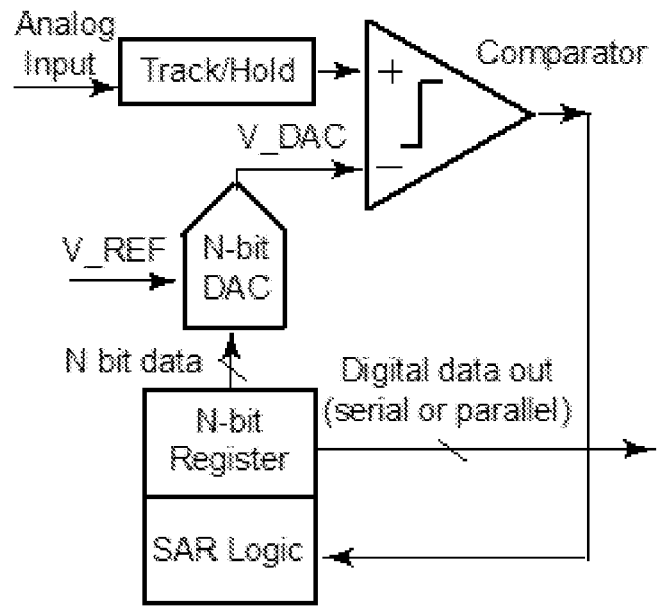
FIG. 7A is diagram which illustrates a successive-approximation-register analog to digital converter ("SAR ADC") as known in the prior art.
Figure 7B:
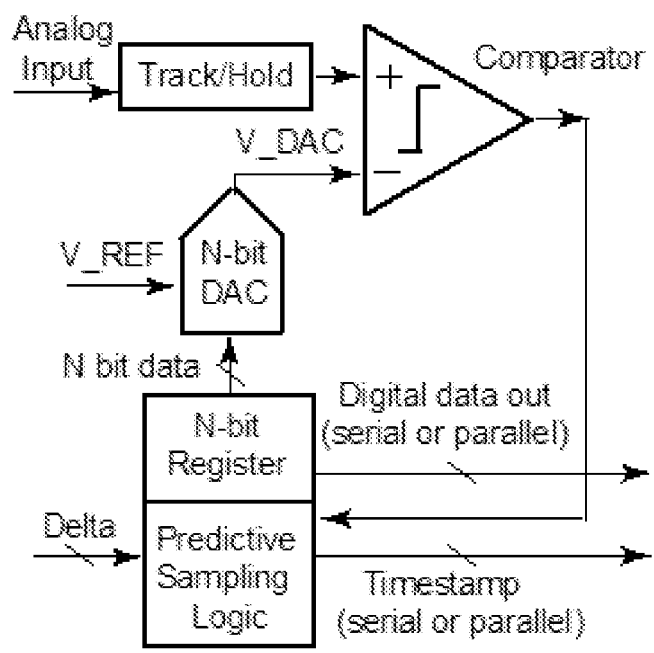
FIG. 7B is a diagram which illustrates a dynamic prediction sampling-based ADC implementation according to an embodiment of the present invention.

The overall system operation can be monitored and controlled by a control unit running a state machine. The control unit can be implemented on the same integrated circuit or on a separate component-including for example a field-programmable gate array or a computer. The state machine in the control unit indicates the current state and the next state of system operation, the states can include sampling, prediction, comparison, conversion, and filtering. The system can be implemented either with single-ended input or differential input The dynamic predictive sampling system can be implemented in an ADC—optionally, for example, similar to a SAR ADC by replacing the successive approximation control logic with the predictive sampling logic, as illustrated in FIG. 7A. In conventional SAR ADC, the analog input voltage is first held on track/hold circuitry and compared to an analog value, V_DAC, generated by an N-bit digital to analog converter based on an analog reference voltage, V_REF, which is controlled by an N-bit register, whose value comes from the binary search result of the SAR logic. The digital output data is calculated bit-by-bit in the SAR logic according to the comparator result until conversions of all N bits are completed. The system then restarts the process for the next sampling. In SAR ADC, each analog signal sampling is converted into N-bit digital data. In contrast, in the predictive-sampling-based ADC (see FIG. 7B), only two N-bit conversions are made at the beginning. Then the predictive sampling logic first generates the predicted digital value based on the first two conversions using Equation 1. After that, the system calculates the upper and lower threshold voltages for the N-bit DAC based on the comparator result and the digital Delta value. The upper and lower threshold voltages are preferably calculated digitally using the predicted digital value to add and subtract the digital Delta value.

The comparator first compares the input analog voltage with the upper threshold voltage, then compares the input analog voltage with the lower threshold voltage. if the prediction is successful, which means the analog input is lower than the upper threshold voltage and higher than the lower threshold voltage, no further comparison or analog to digital comparison will be performed. The process restarts for the next sampling. If the sampling is out of the prediction range, the sampling is converted into N-bit digital data using the process of SAR ADC. The timing difference between two out-of-range samplings is recorded as the digital timestamps, which is an additional output compared to SAR ADC. Such a dynamic predictive sampling system can be fabricated in a single integrated circuit or in separated components.

Note that in the specification and claims, "about", "approximately", and/or "substantially" means within twenty percent (20%) of the amount, value, or condition given. The terms, "a", "an", "the", and "said" mean "one or more" unless context explicitly dictates otherwise. Optionally, data processing and/or initiation of the various steps can be performed by an appropriately programmed microprocessor, computing cloud, Application Specific Integrated Circuit (ASIC), Field Programmable Gate Array (FPGA), or the like, in conjunction with appropriate memory, network, and bus elements. One or more processors and/or microcontrollers can operate via instructions of the computer code and the software is preferably stored on one or more tangible non-transitive memory-storage devices.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all references, applications, patents, and publications cited above and/or in the attachments, and of the corresponding application(s), are hereby incorporated by reference. Unless specifically stated as being "essential" above, none of the various components or the interrelationship thereof are essential to the operation of the invention. Rather, desirable results can be achieved by substituting various components and/or reconfiguration of their relationships with one another. Embodiments of the present invention can include every combination of features that are disclosed herein independently from each other. Although the invention has been described in detail with particular reference to the disclosed embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference. Unless specifically stated as being "essential" above, none of the various components or the interrelationship thereof are essential to the operation of the invention. Rather, desirable results can be achieved by substituting various components and/or reconfiguring their relationships with one another.

What is claimed is:

1. An electrical signal processing apparatus comprising:
  a digital dynamic predictive sampling system configured to predict a digital value of an incoming analog sampling value;
  an analog sampling and quantization circuit;
  said digital dynamic predictive sampling system configured to provide digital feedback to said analog sampling circuit; and said electrical signal processing apparatus configured to generate a digital data output and a digital timestamp output from an analog input signal and a pre-defined delta step value.

2. The electrical signal processing apparatus of claim 1 wherein said digital dynamic predictive sampling system is configured to take two digital sampling values and calculate the predicted value of a next sampling using linear prediction.

3. The electrical signal processing apparatus of claim 1 wherein said digital dynamic predictive system is configured to perform full analog to digital conversions for two samples and calculate a predicted value of a next sampling using linear prediction.

4. The electrical signal processing apparatus of claim 1 wherein said electrical signal processing apparatus is configured to calculate two thresholds by adding and subtracting the predicted value by the pre-defined delta step value, and wherein said two thresholds respectively comprise an upper threshold digital value and a lower threshold digital value.

5. The electrical signal processing apparatus of claim 4 wherein said electrical signal processing apparatus is configured to start a comparing process when a new sampling value is compared with the two thresholds if the new sampling value is between the upper threshold and the lower threshold, and wherein when the prediction is considered successful, the predicted value and the last sampling value are applied to calculate a next predicted value.

6. The electrical signal processing apparatus of claim 5 wherein said electrical signal processing apparatus is configured to initiate a recording process when a new sampling value is not between the upper threshold and the lower threshold.

7. The electrical signal processing apparatus of claim 1 wherein said electrical signal processing apparatus is configured to record a current sampling digital value.

8. The electrical signal processing apparatus of claim 1 wherein said electrical signal processing apparatus is configured to perform a full analog to digital conversion and record a value.

9. The electrical signal processing apparatus of claim 8 wherein the recorded value is the digital data output.

10. The electrical signal processing apparatus of claim 8 wherein said electrical signal processing apparatus is configured to initiate a subsequent prediction process after the value is recorded.

11. The electrical signal processing apparatus of claim 1 further comprising a digital timer with a reset value of zero, said digital timer configured to start counting a number of clock cycles when a recording process begins.

12. The electrical signal processing apparatus of claim 11 wherein said electrical signal processing apparatus is configured to record a digital timer value.

13. The electrical signal processing apparatus of claim 12 wherein said digital timer recorded value is used as the timestamp output of said electrical signal processing apparatus and wherein said digital timer is reset to zero and configured to begin counting until a subsequent recording process.

14. The electrical signal processing apparatus of claim 1 configured to apply a neighbor amplitude filter after said dynamic predictive sampling system to remove samples in an episode of low-amplitude high-frequency noise.

15. The electrical signal processing apparatus of claim 14 wherein said neighbor amplitude filter is configured to set a protection window for a starting sampling point with a predetermined time and amplitude and remove other sampling points after the starting sampling point when the other sampling points are within a window except if one or more of the other sampling points have an amplitude difference that is higher than a user-defined value.

16. The electrical signal processing apparatus of claim 15 wherein after stopping, said neighbor amplitude filter is configured to then search for a next starting sampling point.

17. The electrical signal processing apparatus of claim 1 further comprising a slope filter applied after said dynamic predictive sampling system, wherein said slope filter is configured to remove samplings in a high-amplitude low-frequency baseline wandering.

18. The electrical signal processing apparatus of claim 17 wherein said slope filter is configured to calculate slopes of specific sampling points with their prior and later sampling points, wherein the specific sampling points are sampling points whose amplitudes are not maximum or minimum values in an original waveform.

19. The electrical signal processing apparatus of claim 18 wherein said slope filter is configured such that if a relative difference between a prior slope and a later slope is lower than a slope threshold, the sampling point is removed.

20. The electrical signal processing apparatus of claim 19 configured such that a larger slope threshold removes more sampling points than is the case for a slope threshold that is smaller, at a cost of a higher distortion of a final piece-wise linear waveform compared to an original waveform.

21. The electrical signal processing apparatus of claim 1 wherein said electrical signal processing apparatus comprises an integrated circuit and wherein said digital dynamic predictive sampling system comprises a block of said integrated circuit.

22. The electrical signal processing apparatus of claim 1 wherein said electrical signal processing apparatus comprises a digital signal processing apparatus.

23. The electrical signal processing apparatus of claim 1 wherein said electrical signal processing apparatus comprises an analog signal processing apparatus.

24. An electrical signal processing apparatus comprising:
a digital dynamic predictive sampling system configured to predict a digital value of an incoming analog sampling value;
an analog sampling and quantization circuit; and
said digital dynamic predictive sampling system configured to:
provide digital feedback to said analog sampling circuit; and
take two digital sampling values and calculate the predicted value of a next sampling using linear prediction.

25. The electrical signal processing apparatus of claim 24 wherein said electrical signal processing apparatus is configured to apply a neighbor amplitude filter after said dynamic predictive sampling system to remove samples in an episode of low-amplitude high-frequency noise.

26. The electrical signal processing apparatus of claim 24 further comprising a slope filter applied after said dynamic predictive sampling system, wherein said slope filter is configured to remove samplings in a high-amplitude low-frequency baseline wandering.

27. The electrical signal processing apparatus of claim 24 wherein said electrical signal processing apparatus comprises an integrated circuit and wherein said digital dynamic predictive sampling system comprises a block of said integrated circuit.

28. An electrical signal processing apparatus comprising:
a digital dynamic predictive sampling system configured to predict a digital value of an incoming analog sampling value;
an analog sampling and quantization circuit; and
said digital dynamic predictive sampling system configured to:
provide digital feedback to said analog sampling circuit; and
perform full analog to digital conversions for two samples and calculate a predicted value of a next sampling using linear prediction.

29. The electrical signal processing apparatus of claim 28 wherein said electrical signal processing apparatus is configured to apply a neighbor amplitude filter after said dynamic predictive sampling system to remove samples in an episode of low-amplitude high-frequency noise.

30. The electrical signal processing apparatus of claim 28 further comprising a slope filter applied after said dynamic predictive sampling system, wherein said slope filter is configured to remove samplings in a high-amplitude low-frequency baseline wandering.

31. The electrical signal processing apparatus of claim 28 wherein said electrical signal processing apparatus comprises an integrated circuit and wherein said digital dynamic predictive sampling system comprises a block of said integrated circuit.

32. An electrical signal processing apparatus comprising:
a digital dynamic predictive sampling system configured to predict a digital value of an incoming analog sampling value;
an analog sampling and quantization circuit;
said digital dynamic predictive sampling system configured to provide digital feedback to said analog sampling circuit; and
said electrical signal processing apparatus is configured to calculate two thresholds by adding and subtracting the predicted value by a delta step value, and wherein said two thresholds respectively comprise an upper threshold digital value and a lower threshold digital value.

33. The electrical signal processing apparatus of claim 32 wherein said electrical signal processing apparatus is configured to apply a neighbor amplitude filter after said dynamic predictive sampling system to remove samples in an episode of low-amplitude high-frequency noise.

34. The electrical signal processing apparatus of claim 32 further comprising a slope filter applied after said dynamic predictive sampling system, wherein said slope filter is configured to remove samplings in a high-amplitude low-frequency baseline wandering.

35. The electrical signal processing apparatus of claim 32 wherein said electrical signal processing apparatus comprises an integrated circuit and wherein said digital dynamic predictive sampling system comprises a block of said integrated circuit.

36. An electrical signal processing apparatus comprising:
a digital dynamic predictive sampling system configured to predict a digital value of an incoming analog sampling value;
an analog sampling and quantization circuit;
said digital dynamic predictive sampling system configured to provide digital feedback to said analog sampling circuit; and
a digital timer with a reset value of zero, said digital timer configured to start counting a number of clock cycles when a recording process begins.

37. The electrical signal processing apparatus of claim 36 wherein said electrical signal processing apparatus is configured to apply a neighbor amplitude filter after said dynamic predictive sampling system to remove samples in an episode of low-amplitude high-frequency noise.

38. The electrical signal processing apparatus of claim 36 further comprising a slope filter applied after said dynamic predictive sampling system, wherein said slope filter is configured to remove samplings in a high-amplitude low-frequency baseline wandering.

39. The electrical signal processing apparatus of claim 36 wherein said electrical signal processing apparatus comprises an integrated circuit and wherein said digital dynamic predictive sampling system comprises a block of said integrated circuit.

* * * * *